(12) United States Patent
Okada

(10) Patent No.: US 7,253,691 B2
(45) Date of Patent: Aug. 7, 2007

(54) PLL CLOCK GENERATOR CIRCUIT AND CLOCK GENERATION METHOD

(75) Inventor: Koji Okada, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 24 days.

(21) Appl. No.: 10/649,672

(22) Filed: Aug. 28, 2003

(65) Prior Publication Data

US 2004/0051591 A1 Mar. 18, 2004

(30) Foreign Application Priority Data

Sep. 12, 2002 (JP) ............................. 2002-266631

(51) Int. Cl.
*H03L 7/085* (2006.01)

(52) U.S. Cl. ............................. 331/1 A; 331/2; 331/8; 331/10; 331/18; 331/25

(58) Field of Classification Search ................ 331/1 A, 331/2, 8, 10, 17, 18, 25, 23, 57; 713/501
See application file for complete search history.

(56) References Cited

U.S. PATENT DOCUMENTS

| 5,978,425 A | 11/1999 | Takla |
| 6,160,861 A | 12/2000 | McCollough |
| 6,229,400 B1 | 5/2001 | McCollough et al. ......... 331/17 |
| 6,404,294 B1 * | 6/2002 | Sha et al. ..................... 331/57 |
| 2002/0079973 A1 | 6/2002 | Higashi et al. |

FOREIGN PATENT DOCUMENTS

JP    2000-101424    4/2000

* cited by examiner

*Primary Examiner*—Michael B. Shingleton
(74) *Attorney, Agent, or Firm*—Arent Fox LLP

(57) ABSTRACT

A clock generator circuit is provided wherein a comparison clock signal is generated by comparing a standard clock signal and an operating clock signal. The comparison clock signal is converted into a current signal. The current signal is converted to multiple current signals and an operating clock signal having multiple varying frequencies is generated based on the multiple current signals.

18 Claims, 20 Drawing Sheets

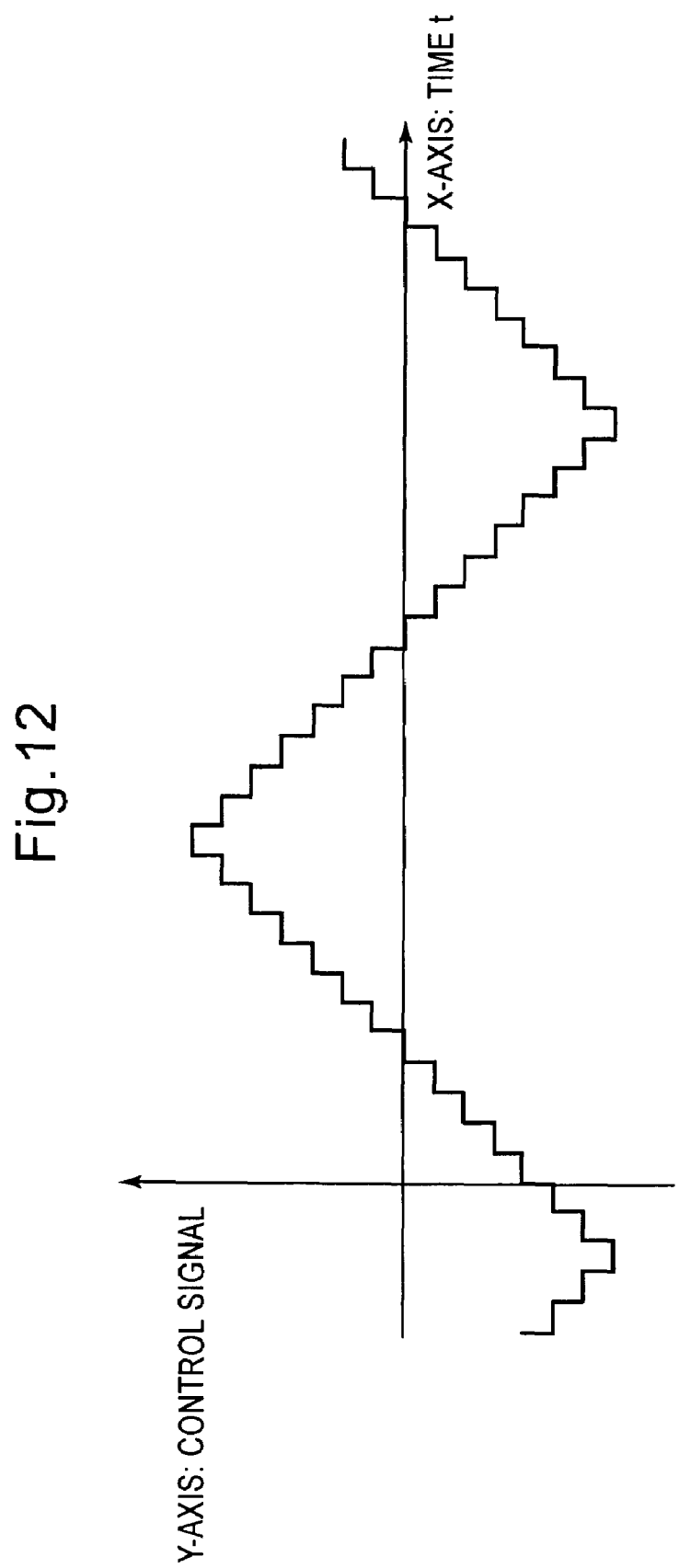

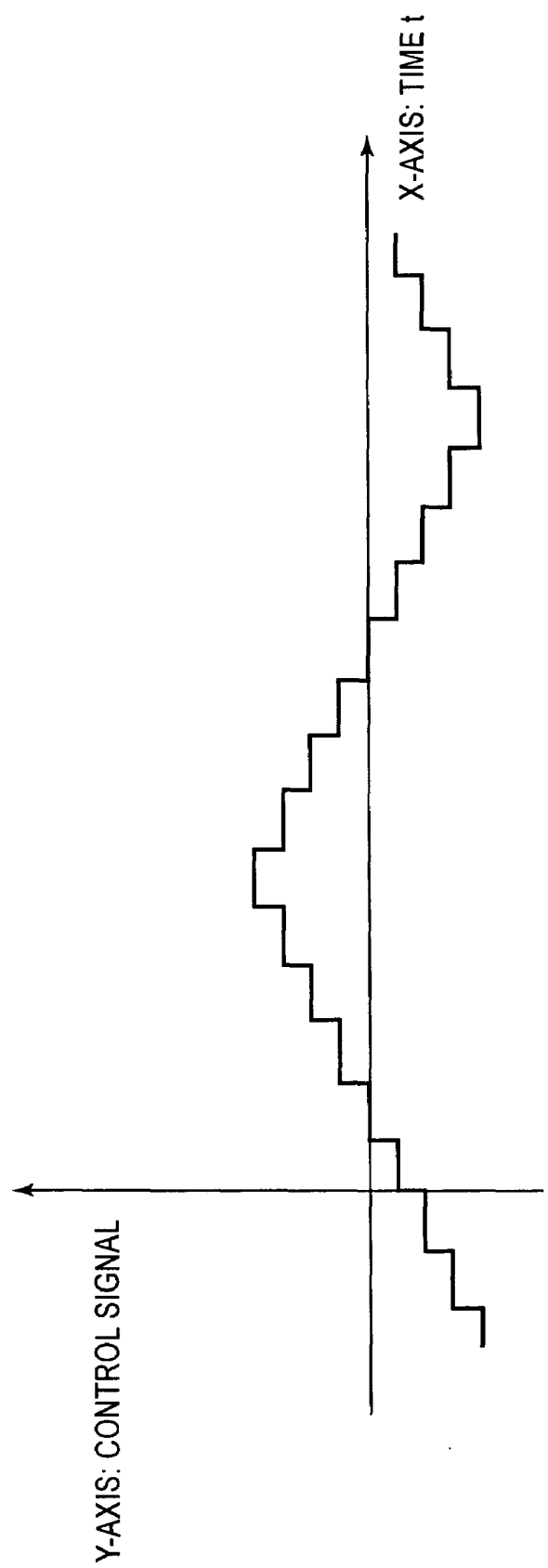

TIME

PLL CLOCK GENERATOR CIRCUIT AND CLOCK GENERATION METHOD

CROSS-REFERENCE TO RELATED APPLICATIONS

This application is based upon and claims the benefit of priority from Japanese Patent Application No. 2002-266631, filed in Sep. 12, 2002, the entire contents of which are incorporated herein by reference.

FIELD OF THE INVENTION

The present invention is related to a clock generator circuit that generates the operating clock of a semiconductor device, and is in particularly related to a clock generator device that reduces electromagnetic bandwidth radiation by achieving diffusion of the frequency spectrum.

BACKGROUND OF THE INVENTION

Description of Related Art

Due to the increased capacity of semiconductor devices, the operating clock of the semiconductor device equipment (operating frequency) has been greatly improved over the past few years. However, this has been accompanied by the problem caused by the impact of the electromagnetic bandwidth radiation by the clock generator circuit on the surrounding circuits.

FIG. 1 is a diagram of a conventional PLL (Phase Locked Loop) clock generator circuit. PLL 1 oscillates by generating the semiconductor operating clock. PLL 1 includes a 1/N frequency divider 2, phase comparator 3, CP (Charge pump) 4, loop filter 5, VCO (voltage controlled oscillator) 6, and 1/M frequency divider device 7. The standard clock RCLK is supplied to the 1/N frequency divider 2 and is divided 1/N times (N is an integer), and then supplied to the phase comparator 3. The signal generated in VCO 6 is supplied to the 1/M frequency divider 7 and is divided 1/M times (M is an integer). The signals are then supplied to the phase comparator 3. The standard clock RCLK, which has been divided 1/N times, as well as the signals which have been divided 1/M times are compared in the phase comparator 3 and the comparison signal corresponding to the compared phase difference is provided to the CP 4.

The CP 4 supplies a signal that is based on the comparison signal to the loop filter 5. The loop filter 5 removes all the noise, etc., of the high frequency components of the signal and smoothes the signals out. The signals are then supplied to VCO 6. Based on the smoothed signals that have been outputted from the loop filter 5, VCO 6 outputs the operating clock CLK. The operating clock CLK is M/N times the standard clock RCLK. In this manner, PLL 1 generates the operating clock CLK with a specified frequency that is generated based on the standard clock RCLK and then oscillates the clock.

However, in order that the frequency keeps oscillating with a specified operation clock, a problem occurs in PLL 1 wherein the electromagnetic waves that are radiated from PLL 1 are very large and have a tremendous impact on the surrounding electronic devices.

FIG. 2 shows the frequency spectrum of the clock that is oscillated by the PLL 1 in FIG. 1. When PLL 1 is operated such that the specified operation clock oscillates (for example, at 16 MHz), the oscillation frequency spectrum shows a very large peak value "0" as shown in FIG. 2. Due to this, the electromagnetic waves that are radiated from PLL 1 also become extremely large. The maximum electromagnetic radiation may cause malfunctioning and errors in operation of other electronic devices. As there is a possibility of the electromagnetic radiation affecting human beings as well, this poses a grave problem.

The same problem also arises in the PLL oscillator as described in Patent Publication 1995-143001.

SUMMARY OF THE INVENTION

In order to solve the above-mentioned problems, a clock generator circuit is provided that is equipped with a standard clock and an operation clock that is inputted in the phase comparator as well as a voltage controlled oscillator that generates the above mentioned operation clock based on the output signal of the aforementioned phase comparator, the present invention provides a clock generation circuit wherein the voltage controlled oscillator is equipped with a voltage controlled oscillator that converts the voltage signal to a current signal and the current variable current circuit that can convert the aforementioned current signal and also the voltage controlled oscillator that oscillates the frequency based on the aforementioned variable current signal.

To achieve the above aspect, the clock generator circuit of the present invention includes a phase comparator that receives by a standard clock signal and an operating clock signal. A voltage controlled oscillator generates the operating clock based on the output signal of the phase comparator. The voltage controlled oscillator includes a voltage current converter that converts a voltage signal into a current signal, a variable current circuit that fluctuates the current signal and an current controlled oscillator that oscillates the frequency of the operating clock signal based on the variable current signals.

A further aspect of the present invention is a clock generator circuit where the variable current circuit is at least a current D/A converter or a current D/A converter with an attached low pass filter.

A further aspect of the present invention is a clock generator circuit that controls the variable current circuit.

A further aspect of the present invention is a clock generation circuit where the variable current circuit includes means to determine the range of change of frequency of the clock oscillated by the current controlled oscillator.

A further aspect of the present invention is a method of generating a operating clock for a clock generator circuit wherein the results of comparison between the standard clock and the operating clock are converted to current signals, and based on the current signals, the operation clock is generated. The clock generator circuit further includes a first circuit that generates multiple current signals by changing the current signals and a second circuit that generates clock signals with multiple varying frequencies based on the multiple current signals.

A further aspect of the present invention is a clock generator circuit that is equipped with a control circuit that controls the first circuit.

A further aspect of the present invention is a clock generator that includes a phase comparator which outputs the results of a comparison between a standard clock signal and operating clock signal. A first circuit generates current signals based on the results of the comparison as well as a second circuit that generates a first current and a second current based on the current signal. Furthermore, the clock generator circuit also includes a third circuit that generates a second frequency clock based on the second current signal along with the generation of the clock with the first frequency based on the first current signal.

A further aspect of the present invention is a clock generator circuit that includes a first clock generator part that generates a first clock, and a second clock generator part that generates a second clock. The first clock generator part includes a phase comparator that compares a standard clock and an operating clock. A voltage current converter converts the signal based on the comparison results into current signals. A first voltage controlled oscillator generates the first operating clock based on the current signal. The second clock generator part further includes a variable current circuit that converts the current signals. A second current controlled oscillator oscillates the frequency of the output based on the variable current signal.

A further aspect of the present invention is a clock generator circuit wherein a control circuit controls the current variable current circuit.

A further aspect of the present invention is a clock generator circuit wherein the first clock generator part includes a corrective circuit that corrects the current and supplies the current to the first voltage controlled oscillator.

A further aspect of the present invention is method of generating an operating clock of a clock generator circuit. The method includes generating a first clock of a frequency spectrum containing N number of peaks (N is an integer that is greater than 1A); generating a current signal on the basis of the comparison results obtained between the standard clock signal and operating clock signal, it is equipped with a method to generate the second clock containing a frequency spectrum with M number of peaks (N is an integer that is greater than 1, M>N).

A further aspect of the present invention is a PLL circuit that includes a phase comparator that receives a standard clock signal and an operating clock signal. The output of a charge pump is supplied to a voltage controlled oscillator that outputs the operating clock based on the output of the charge pump. The voltage controlled oscillator includes a voltage current converter that converts a voltage signal into a current signal, a current variable current circuit that varies the current signal, and a current controlled oscillator that oscillates the frequency of the operating clock signal based on the variable current signal.

A further aspect of the present invention is an operation clock generation method wherein a standard clock signal and an operating clock signal are compared and the results of the comparison is converted into current signals. The current signals are changed based on a control signal, and the operating clock signal. Varying frequencies are outputted based on the variable current signal.

A further aspect of the present invention is an operation clock generation method including the steps of: comparing the standard clock signal and an operating clock signal; converting the results of the comparison into current signals, generating a first current signal and a second current signal based on the current signals and on a control signal; and generating a first frequency clock based on the first current signal and generating a second frequency clock based on the second current signal.

A further aspect of the present invention is a clock generator circuit method including comparing the standard clock and the comparison clock, and generating multiple current signals on the basis of the aforementioned results of comparison and further generating a clock with a frequency spectrum containing M number of peaks (M is an integer that is greater than 2) based on the aforementioned current signals.

BRIEF DESCRIPTION OF THE DRAWINGS

The present invention, together with the aspects and advantages thereof, may best be understood by reference to the following description of the presently preferred embodiments together with the accompanying drawings.

FIG. 12 is an illustration of a waveform of a first example of the control signals output from control circuit 27.

FIG. 14 is an illustration showing a second example of a modulated waveform of the control signals output from the control circuit shown in FIG. 13.

DETAILED DESCRIPTION OF THE INVENTION

Figure 3:
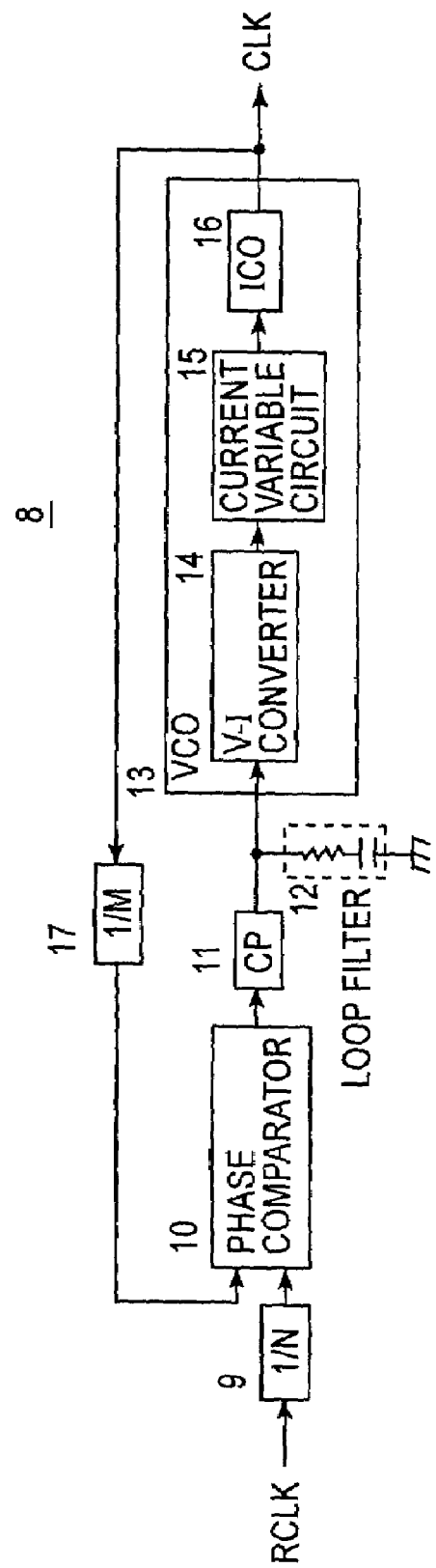
FIG. 3 is a logical representation of the present invention.

FIG. 3 illustrates a logical diagram of the present invention. The clock generation circuit 8 is designed to fluctuate the oscillation frequency.

Figure 1:
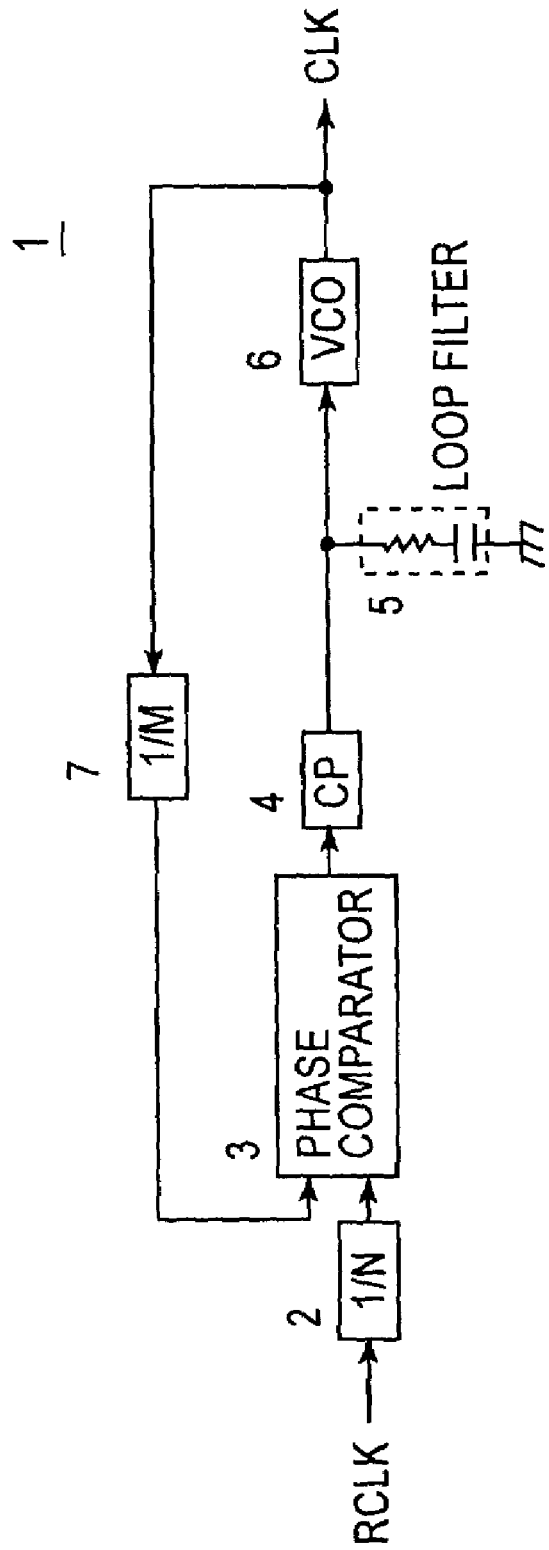
FIG. 1 illustrates a conventional circuit diagram of a PLL circuit.

The clock generator circuit 8 includes generally the same components as shown in FIG. 1. The circuit includes 1/N frequency divider 9, the phase comparator 10, CP (charge pump) 11, loop filter 12, VCO (voltage controlled oscillator) 13, and 1/M frequency divider 17.

The VCO 13 includes V-I converter (voltage current converter) 14, current variable current circuit 15, and ICO (current controlled oscillator) 16.

The V-I converter 14 converts the voltage signal from CP 11 to a current signal. The current variable current circuit 15 changes the converted current signal and ICO 16 oscillates the frequency corresponding to the current signal that was fluctuated.

In the present invention, the oscillation frequency is fluctuated by changing the current signal that controls the oscillator frequency by using the current variable circuit.

Using the clock generation circuit of the present invention, the following results may be obtained:

(1) The oscillation frequency spectrum is effectively diffused and therefore, enables a reduction in the electromagnetic radiation. By fluctuating the frequency oscillated by the clock generation circuit, the peak of the oscillation frequency spectrum is dispersed.

Figure 4:
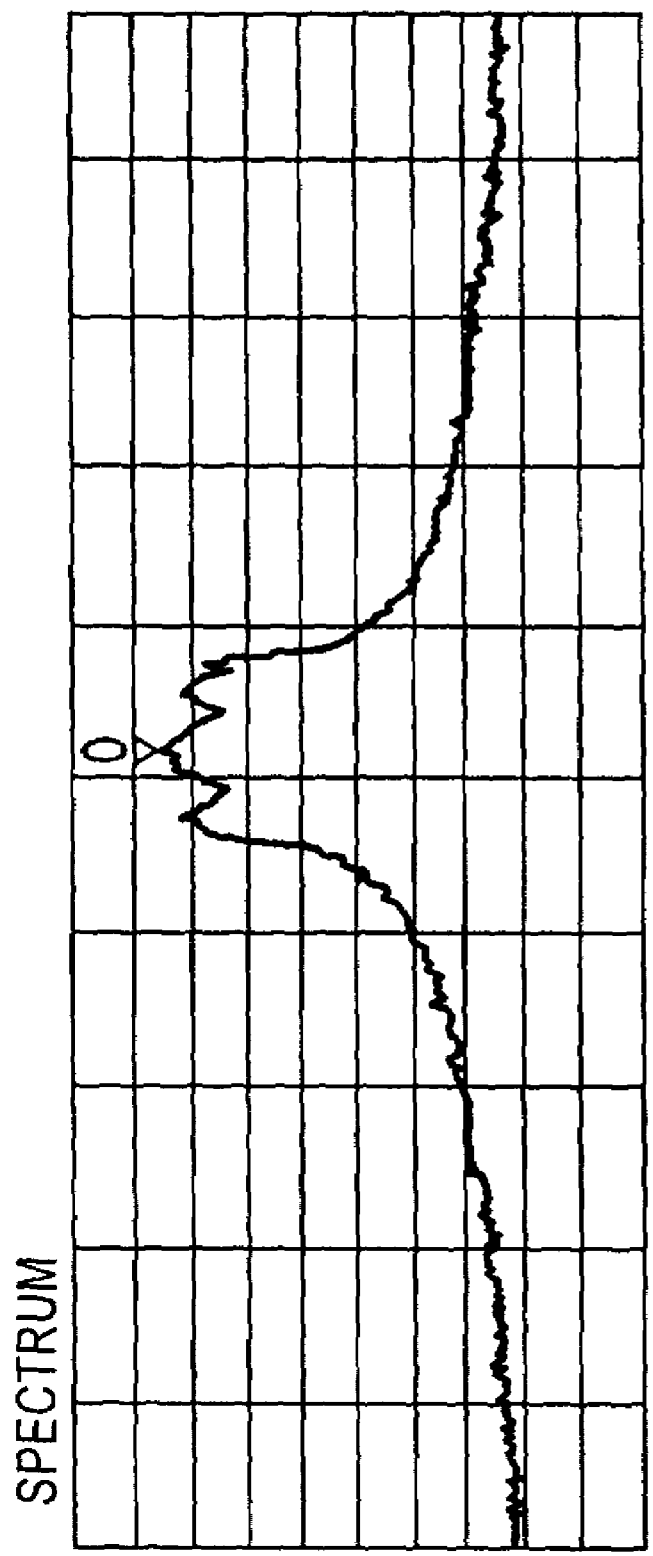
FIG. 4 is a graph illustrating the frequency spectrum-1 of the clock generator circuit of FIG. 3.

FIG. 4 shows the frequency spectrum-1 that is oscillated by the clock generation circuit shown in FIG. 3.

Figure 2:
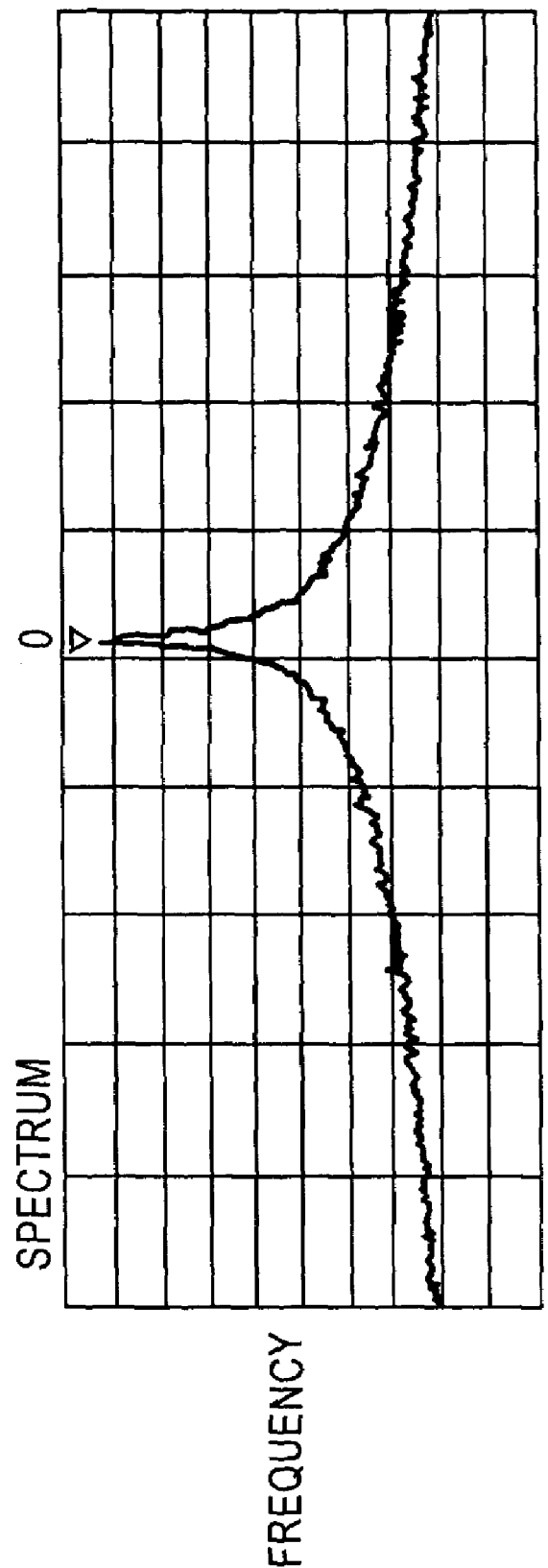
FIG. 2 is a graph illustrating the frequency spectrum of the conventional PLL circuit.

As shown in FIG. 4, the unique peak of the traditional PLL frequency spectrum shown in FIG. 2 is dispersed into multiple peaks, each of the peak values become smaller leading to the reduction in the electromagnetic waves that are radiated from the clock generation circuit. As a result, impact to other electronic devices caused by the electromagnetic radiation from the clock generator device is avoided.

Figure 5:
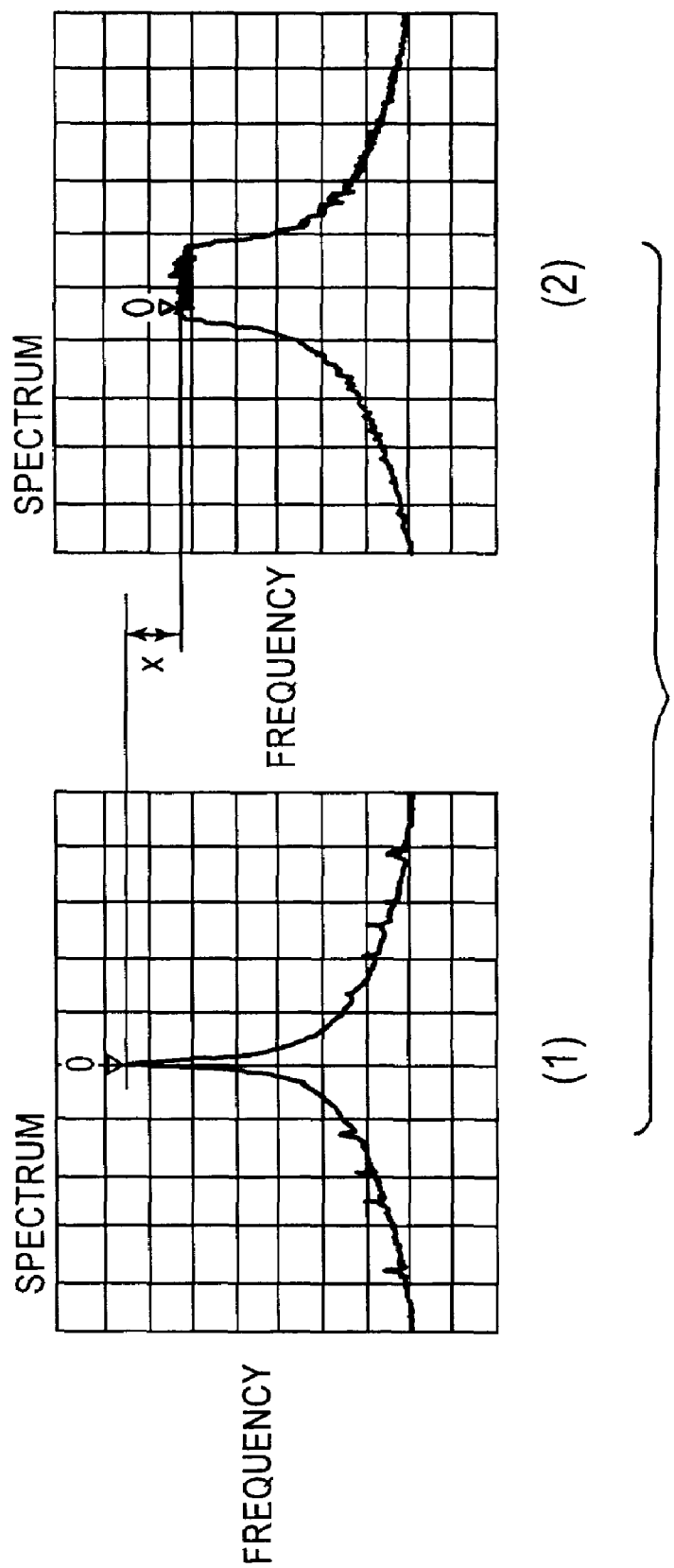
FIG. 5 is a graph illustrating the further dispersion of frequency spectrum-2 of the clock generator circuit of FIG. 3.

FIG. 5 (1) shows the frequency spectrum-2 which is oscillated by the clock generation circuit of the present invention.

FIG. 5 (2) shows the further dispersion of the frequency spectrum, which is oscillated by the clock generation circuit shown in FIG. 4. As illustrated, the peak of the spectrum almost vanishes and becomes fixed. Further, the unique peak value of the PLL frequency spectrum-1 shown in FIG. 2 is reduced drastically as shown by X. As a result, the electromagnetic waves that are radiated from the clock generator circuit are dramatically reduced.

(2) The degree of dispersion of the oscillation frequency spectrum can be set freely.

By fluctuating the current signal that controls the oscillation frequency based on the control signal, the present invention freely controls the timing and the volume that fluctuates the clock generator circuit oscillation frequency. As a result, the spectrum dispersion of the desired oscillation frequency is realized and a reduction in the electromagnetic radiation is achieved as desired. In particular, in the VCO 13, using an IDAC (current D/A converter) also enables the present invention to digitally control the change of the oscillation frequency. In other words, by merely changing the input pattern to the IDAC, the degree of spectrum dispersion can be controlled and the control becomes greatly simplified.

(3) An accurate transition of the oscillation frequency can be realized.

Further, in the VCO 13, by using an IDAC (current D/A converter), the impact of the parasitic volume is made difficult to receive, which in turn enables the precise transition of the oscillation frequency.

(4) Furthermore, it is possible to effectively handle the dispersion that arises due to the fluctuation in the process, fluctuation in temperature and a fluctuation in the power source voltage.

Based on the current from the V-I converter (voltage current converter) 14, by using the control current when the PLL 8 is in a locked state as the base current, VCO 13 changes the current signal which controls the oscillation frequency. Due to this, the clock generator circuit cannot be impacted easily by the dispersion caused by the fluctuations in process, fluctuations in temperature and fluctuations in power source voltage.

For example, if the input current of the ICO 16 is 10 mA, the clock generation circuit oscillates at 10 mH. When the PLL 8 is in a locked state at 10 MHz, and the input current of the IDAC fluctuates by ±1%, the current input fluctuates within the ranges of 9.9 mA~10.1 mA and the oscillation frequency fluctuates within the ranges of 9.9 MHz~10.1 MHz. In this case, by the process fluctuations, temperature fluctuations and power source voltage fluctuations, when the ICO has an input current of 20 mA, it is assumed that it ends up with 10 MHz oscillation. IDAC fluctuates input current by ±1% using the standard of input current of 20 mA, the current input fluctuates anywhere between the ranges of 19.8 mA~10.2 mA and the oscillation frequency fluctuates within the 9.9 MHz~10.1 MHz range. Since the range of fluctuation is the same as when there is no fluctuation in the process, temperature fluctuations or fluctuation in power source voltage, the impact from process fluctuation, temperature fluctuations or fluctuations in power source voltage fluctuation cannot be seen.

On the one hand, the IDAC in the VCO 13 does not depend on the current from the V-I converter (voltage current converter) 14. In other words, based on a fixed standard current, the current signal which controls the oscillation frequency is assumed to be changed. When PLL 8 is in a locked state at 10 MHz, and if IDAC fluctuates the input current by ±1%, the current input fluctuates between 9.9 mA~10.1 mA while the oscillation frequency fluctuates in the ranges between 9.9 MHz~10.1 MHz. This is the same as the IDAC that modifies the current signal based on the current from the V-I converter (voltage current converter). In this case, on account of the process fluctuation, temperature fluctuations or fluctuations in power source voltage, it is assumed that ICO 16 ends up oscillating at 10 MHz when it has a current input of 20 mA.

Since the IDAC fluctuates the input current by about ±1%, using the standard of the fixed input current 10 mA the current input fluctuates anywhere between the ranges of 19.9 mA~20.1 mA, while the oscillation frequency fluctuates within 9.95 MHz~10.05 MHz.

Comparing this to the case when there are no process fluctuations, temperature fluctuations or fluctuations in power source voltage, the inventors of the present have found that the range of fluctuation is decreased to ±0.5% and the impact from process fluctuation, temperature fluctuations or fluctuations in power source voltage becomes greater.

Consequently, by making use of the IDAC by changing the current signal that controls the oscillation frequency based on the current from the V-I converter (voltage current converter) 14, the present invention enables control of the dispersion generated by the process fluctuation, temperature fluctuations or fluctuations in power source voltage.

Figure 6:
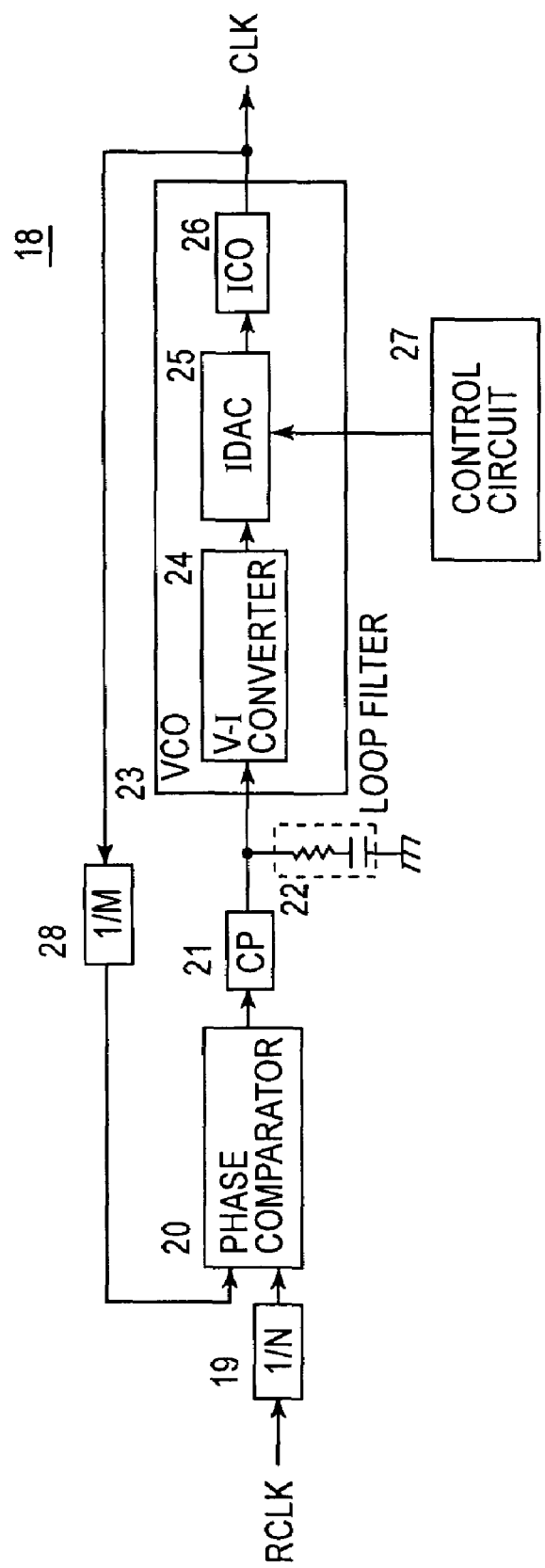
FIG. 6 is a circuit diagram of the first embodiment of the present invention.

FIG. 6 shows a circuit diagram of embodiment one of the present invention.

The PLL 18 in this embodiment includes the IDAC (current D/A converter) as the current variable circuit and changes the oscillation frequency.

As shown in FIG. 6, PLL 18 includes a 1/N frequency divider 19, phase comparator 20, CP (charge pump) 21, loop filter 22, VCO (voltage controlled oscillator) 23, and 1/M frequency divider 28 and apart from the structure of the VCO 23, the structure of PLL 18 is generally the same as the structure of the conventional PLL shown in FIG. 1.

Figure 7:
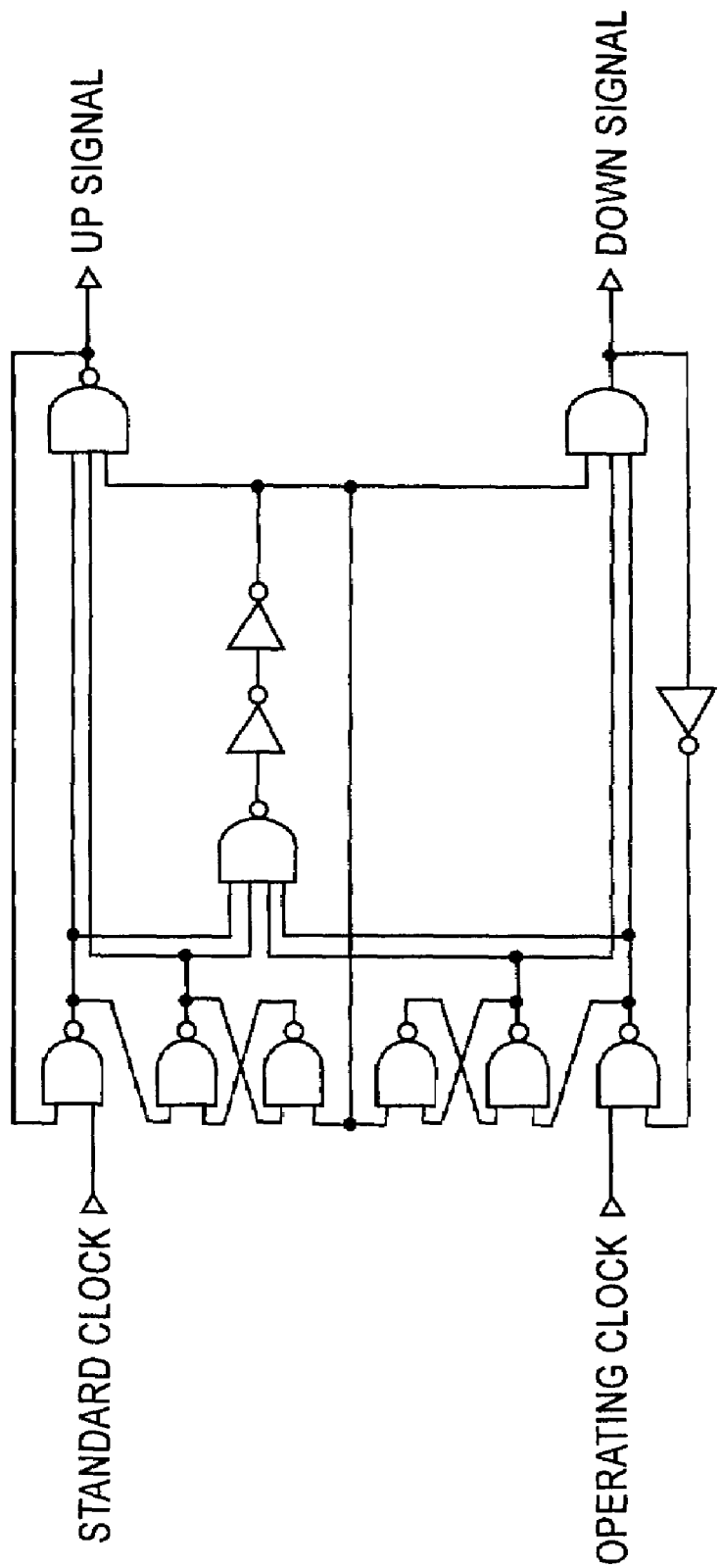
FIG. 7 is an illustration of an example of the phase comparator of FIG. 6.

The phase comparator 20 as shown in FIG. 6 is structured, for example, as shown in FIG. 7. The phase comparator 20 includes nine NAND circuits and three inverter circuits. The phase comparative 20 compares the standard clock and the operation clock and outputs either Up or Down signals. The present invention is not limited by this example. Many other modifications and variations could also be used by one of ordinary skill in the art.

Figure 8:
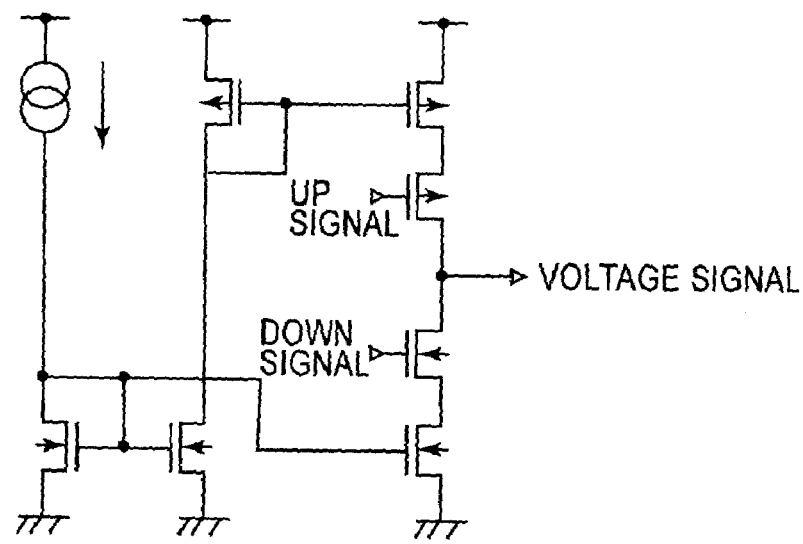
FIG. 8 is an illustration of an example of the charge pump shown in FIG. 6.

The CP 21 (charge pump) shown in FIG. 6 is structured, for example, as shown in FIG. 8 and outputs the voltage signal on the basis of the UP signal and the Down signal supplied from the phase comparator. The CP 21 includes a current supply, three NMOS transistors and four PMOS transistors. The UP signal is supplied to the NMOS transistor provided in the output part. The DOWN signal is supplied to the PMOS transistor provided in the output part. The voltage signal is outputted from the node where the NMOS transistor and the PMOS transistor are connected. The present invention is not limited by this example. Many other modifications and variations could also be used by one of ordinary skill in the art.

The VCO 23 includes V-I converter (voltage current converter) 24, IDAC 25 (current D/A converter) and ICO 26 (current controlled oscillator).

Further, PLL 18 includes control circuit 27 that controls IDAC 25. Based on the control signal from the control circuit 27, IDAC 25 changes the current signal from the V-I converter (voltage current converter) 24 and then outputs the same. ICO 26 then outputs the frequency oscillation that corresponds to the current signal that has been changed and the oscillation frequency is thereby fluctuated.

Figure 9:
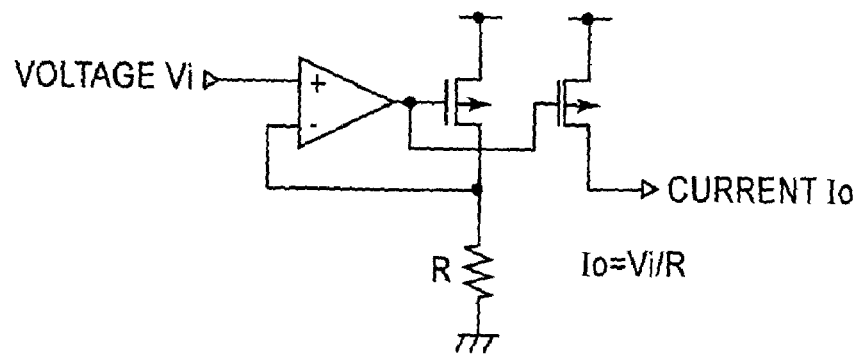
FIG. 9 is an illustration of an example of the V-I converter of FIG. 6.

The V-I converter 24 is structured, for example, as shown in FIG. 9. The V-I converter 24 includes OP-amplifier, two NMOS transistors and a resistor. The voltage input Vi is converted into the current Io and then outputted. The present invention is not limited by this example. Many other modifications and variations could also be used by one of ordinary skill in the art.

Figure 10:
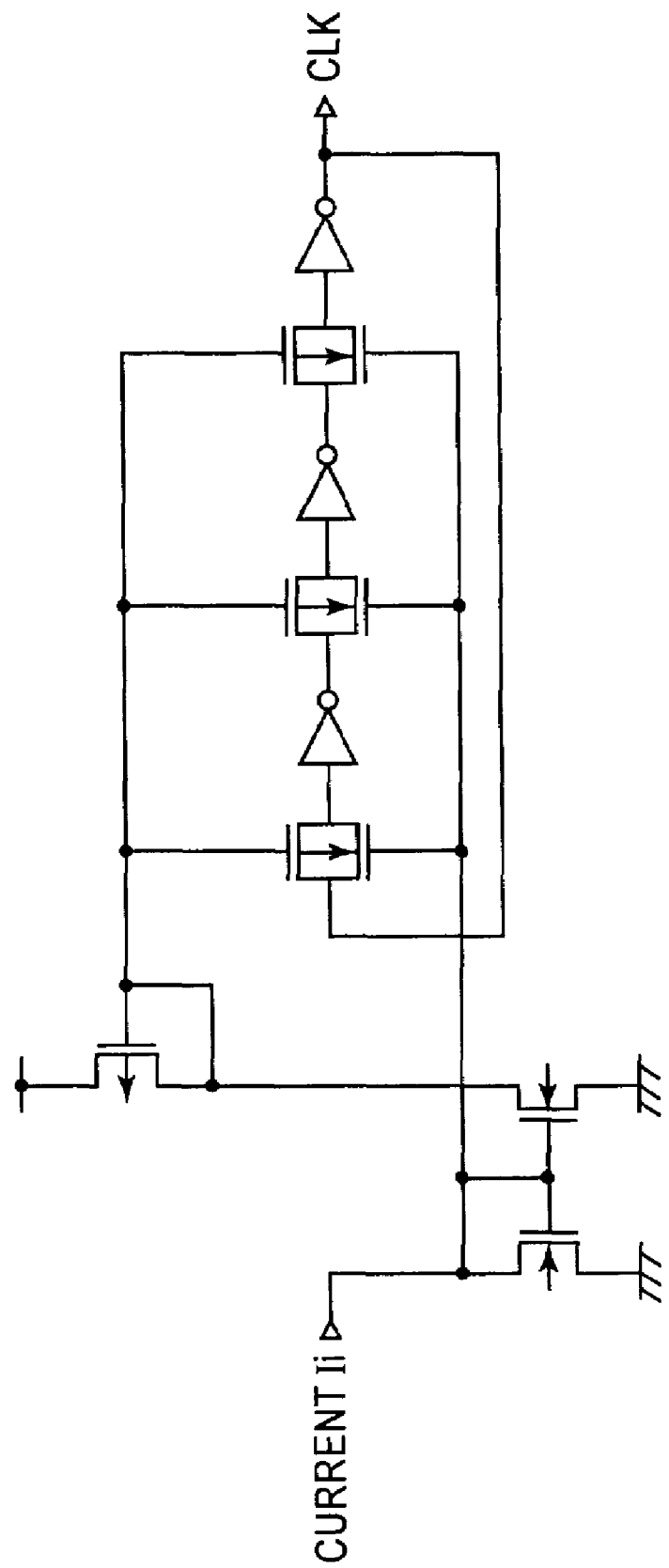
FIG. 10 is an illustration of an example of the ICO of FIG. 6.
Figure 11:
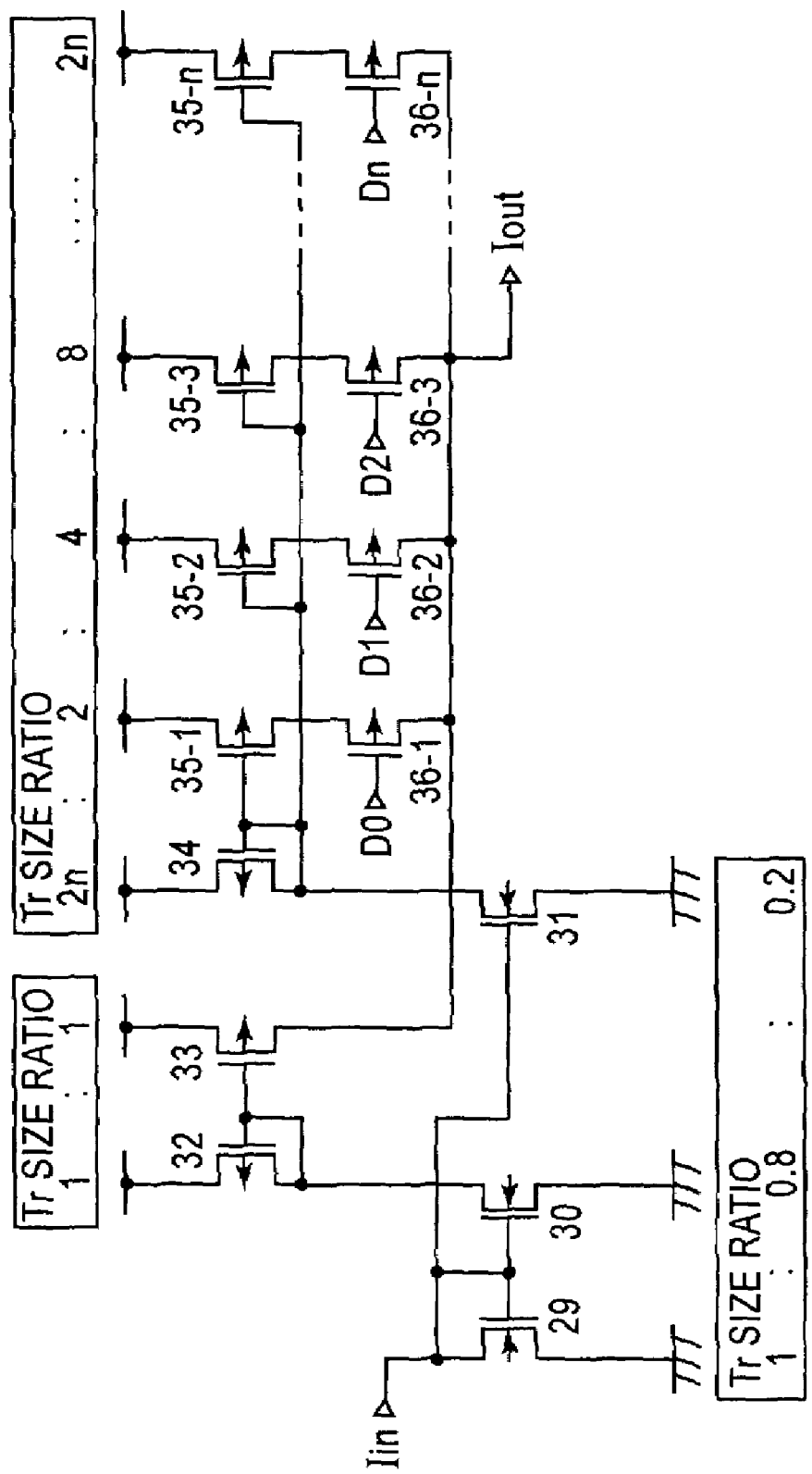
FIG. 11 is an illustration of an example of the IDAC of FIG. 6.

ICO 26 is structured for example as shown in FIG. 10 and oscillates the clock with the frequency corresponding to the current input Ii. ICO 26 includes a NMOS transistor, two PMOS transistor, three inverters and three transfer gates. IDAC 25 is for example, structured as shown in FIG. 11. The present invention is not limited by this example. Many other modifications and variations could also be used by one of ordinary skill in the art.

IDAC 25 is a current D/A converter composed from n bits, and is also made up from the multiple current sources that include current mirror circuits. Based on the input digital signals D0, D1 ... Dn, the current sources are cut off and an analog signal corresponding to the input digital signal is outputted As shown in FIG. 11, the input digital signals D0~Dn are supplied to the NMOS transistor 36-1 to 36-$n$. The NMOS transistor 36-1 to 36-$n$ execute the switch operation and select the current source that corresponds to the input digital signal. In other words, the current circuit (current mirror circuit which consists of any of NMOS transistors that exists within the NMOS transistor 35-1 to 35-$n$ and NMOS transistor 34 are selected. Current flows from the selected current mirror circuit and analog signals are outputted from the output terminal Iout.

Based on the transistor size ratio (W/L), such as the ratio of the channel width W to channel length L of the NMOS transistor 35-1 to 35-$n$, the current mirror circuits are given the weight. The numbers 2n, 2, 4 ... 2n on the upper portion of the NMOS transistor 35-1 to 35-$n$, show the weight given.

In IDAC 25, the front step portion includes PMOS transistors 29, 30 and 31 as well as NMOS transistors 32 and 33, and determines the extent of the range to change the ICO oscillation frequency by keeping the frequency of the standard clock as the center. For example, when the frequency signal within the range of ±20% of the standard clock frequency is oscillated from the ICO, the size ratio of the PMOS transistors 29, 30 and 31 is set at a level of 1:0.8:0.2, and the transistor size ratio of the NMOS transistor 32 and 33 is set at a level of 1:1. By these settings, the frontal step portion of the IDAC 25, based on the current input, controls the ICO in such a manner that the standard clock frequency is oscillated at a frequency within the range of ±20%.

FIG. 12 shows an example of the control signal that is outputted from the control circuit 27. The control signals that are outputted from the control circuit 27 are modulated waveforms as shown in FIG. 12.

Figure 13A:
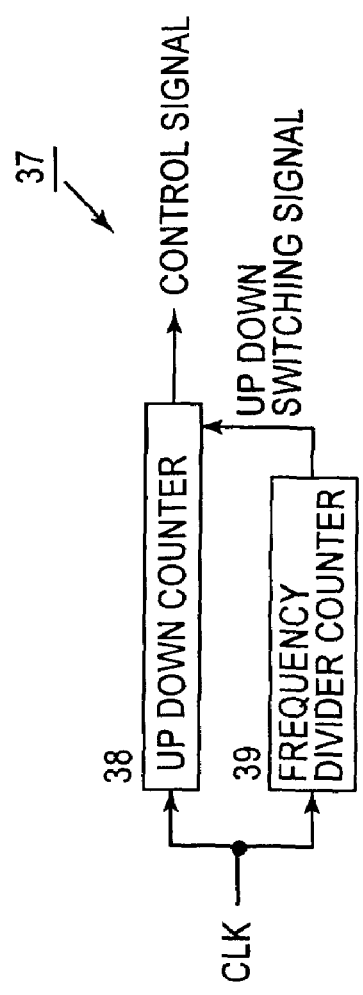
FIGS. 13(a) and 13(b) are illustrations of a first example of the control circuit that controls the IDAC of FIG. 6.
Figure 13B:
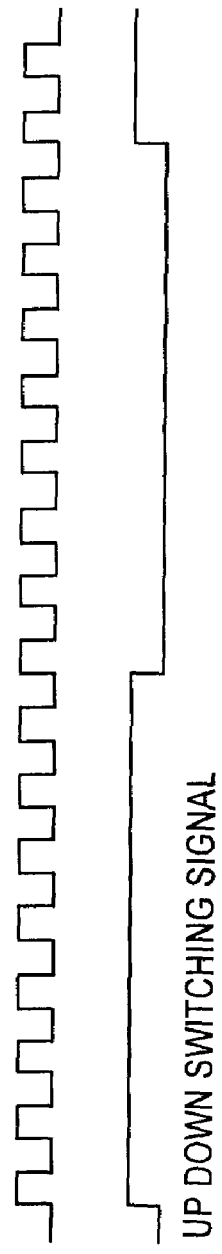

FIG. 13($a$) shows the control circuit 37, which is example no. 1 of the control circuit 27 shown in FIG. 12.

The control circuit 37 is a logic circuit that is a combination of the counter circuits. Control circuit 37 includes Up-Down counter 38 and the frequency divider counter 39. The Up-Down counter 38 is based on the clock CLK and executes in increments or decrements. As shown in FIG. 13($b$), the frequency divider counter 39 divides the clock CLK into ⅛, and in order to switch the Up-Down counter 38 in increments or decrements, outputs the Up-Down switch signal. The Up-Down counter 38, for example, when the Up-Down switch signal is "1", increments the clock CLK counterpart. When the Up-Down switch signal is "0," the clock CLK counter portion is decremented. As a result, the control signal becomes a modulated waveform as shown in FIG. 14.

Figure 15:
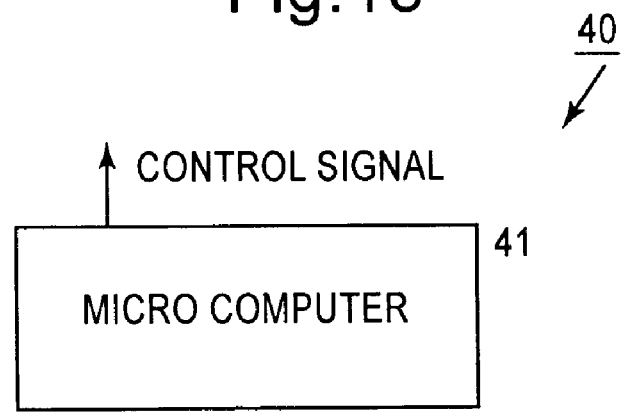
FIG. 15 is an illustration showing a second example of the control circuit that controls the IDAC of FIG. 6.

FIG. 15 shows the control circuit 40, which is example no. 2 of the control circuit 27 shown in FIG. 12.

The control circuit 40 includes microcomputer 41. Based on the control of microcomputer 41, the control circuit outputs control signals as shown displayed in FIG. 12 and FIG. 14.

Figure 16:
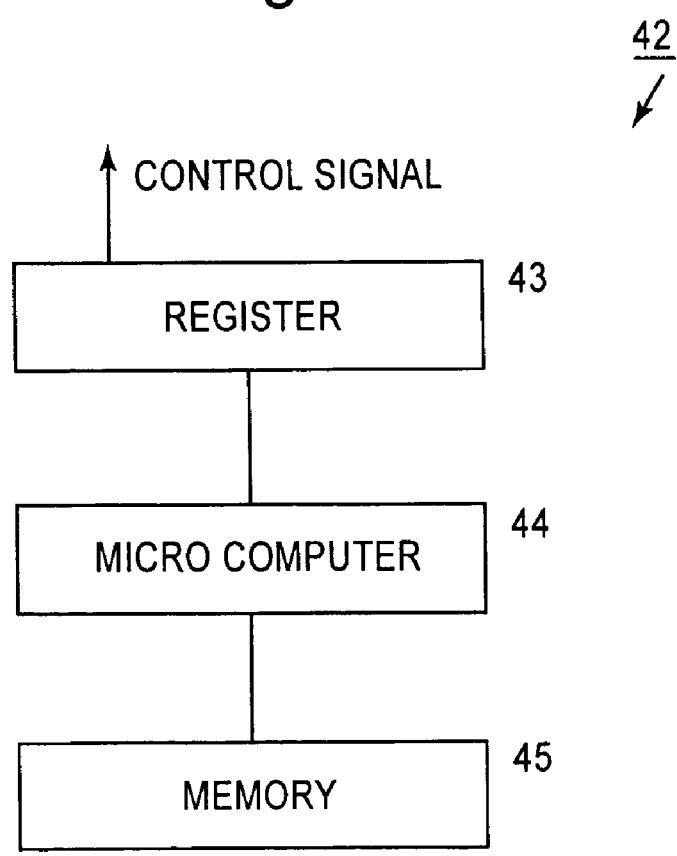
FIG. 16 is an illustration of a third example of the control circuit that controls the IDAC of FIG. 6.

FIG. 16 shows the control circuit 42, which is example no. 3 of the control circuit 27 shown in FIG. 12.

The control circuit 42 includes register 43, microcomputer 44 and memory 45. On the basis of the controls of microcomputer 44, the contents that have been stored in memory 45 are stored temporarily in the register 43. The contents that have been stored in register 43 are outputted as the control signals.

Figure 17:
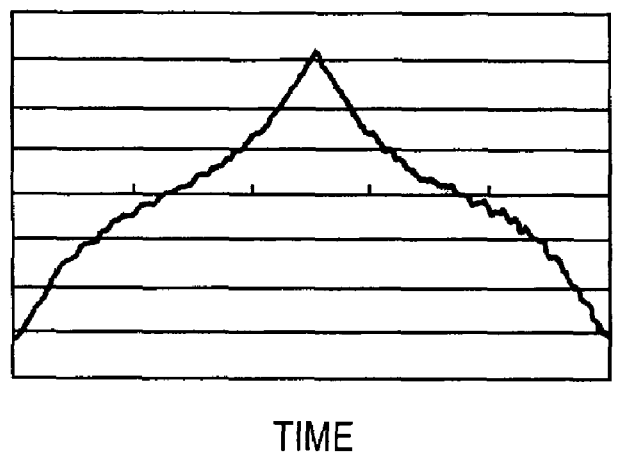
FIG. 17 is an illustration showing a third example of the control signals output from the control circuit of FIG. 6.

FIG. 17 shows an example of the control circuit that is outputted from the control circuit 27 shown in FIG. 12.

Figure 18:
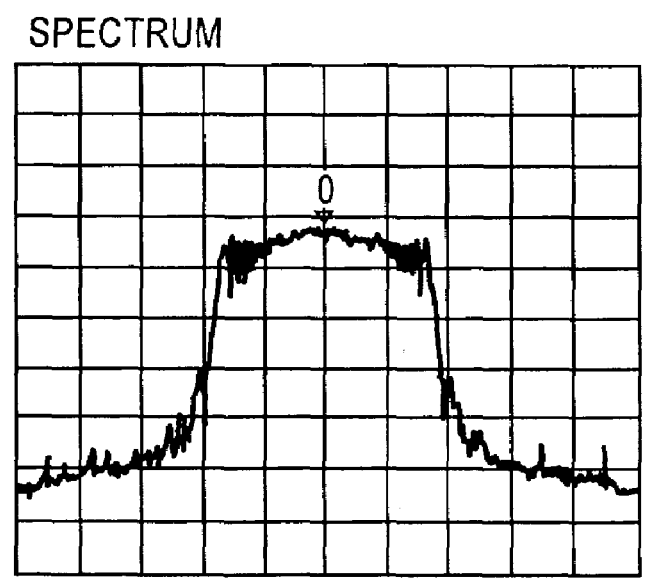
FIG. 18 is a graph illustrating the frequency spectrum-3 of the clock generator circuit according to FIG. 17.

FIG. 18 is the frequency spectrum when modulation is performed using the data from FIG. 17 as control signals.

Figure 19:
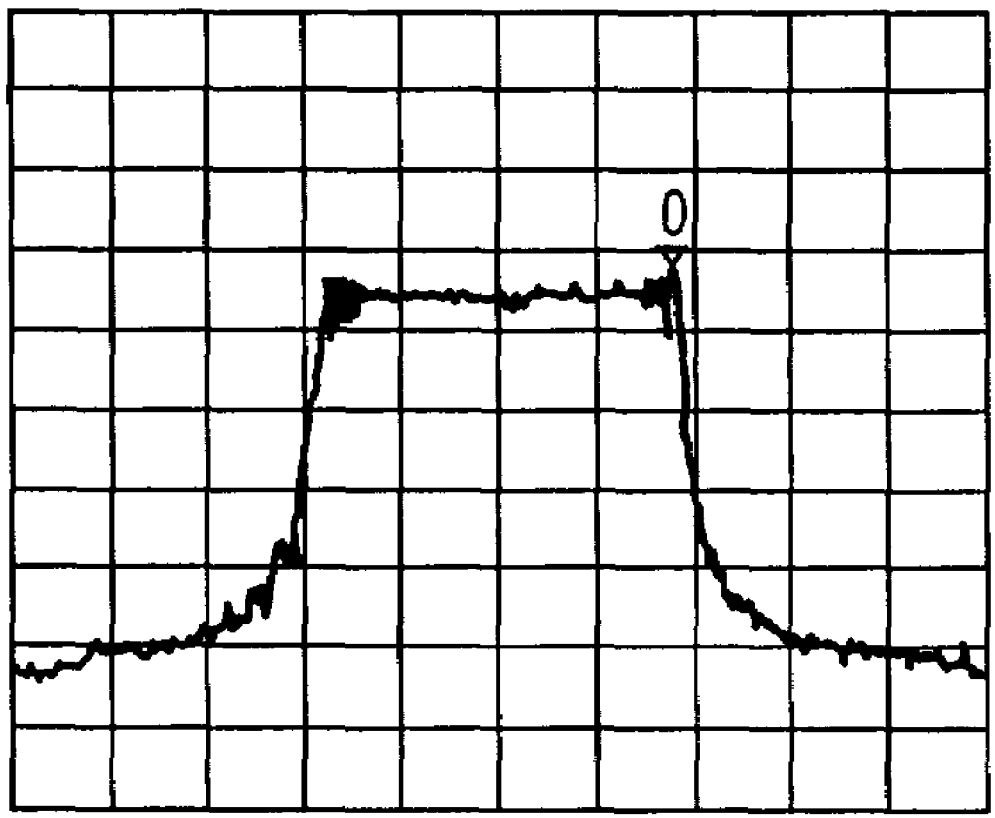
FIG. 19 is a graph illustrating the frequency spectrum-4 of the clock generator circuit according to FIG. 12.

FIG. 19 is the frequency spectrum when modulations are done for the data from FIG. 12 as control signals. As shown in FIG. 19, when the data from FIG. 12 is used as control signals, there are cases when a small peak in both the ends of the special frequency spectrum can be achieved. In such a case, the frequencies on both ends become the frequency with the maximum frequencies. However, with respect to the electronic devices, since it is common that the devices are designed to operate by the frequencies of the central portion of the frequency spectrum, it is desirable to make the frequency with the maximum occurrence as the central part of the frequency spectrum.

As a result, the data shown in FIG. 17 is used as control signals. By making the slope of vicinity of the maximum values and the vicinity of minimum values steep, the frequency of occurrence of the frequencies on both ends is reduced. Further, by making the slope in the vicinity of control signals less steep, the frequency of occurrence of the frequencies in the middle portion is increased.

By making use of the data that is shown in FIG. 17 as the control signal, the frequency in the central part can be made to occur for a maximum number of times in order to obtain the frequency spectrum shown in FIG. 18.

Apart from this, the control signals that are outputted from the control circuit 27 can also be randomly generated data.

In such a manner, in embodiment one of the present invention, the current supplied to ICO 26 using IDAC 25 is made variable and subsequently the oscillation frequency of ICO 26 is made variable. As a result, the peak of the oscillation frequency spectrum shown in FIG. 4 is dispersed and the electromagnetic waves that are radiated from the PLL 18 are reduced.

In embodiment one of the present invention, the oscillation frequency within a very short span of time becomes variable and the average wavelength that is oscillated from PLL 18 is exactly the same as the conventional PLL 1 and there is no problem.

Figure 20:
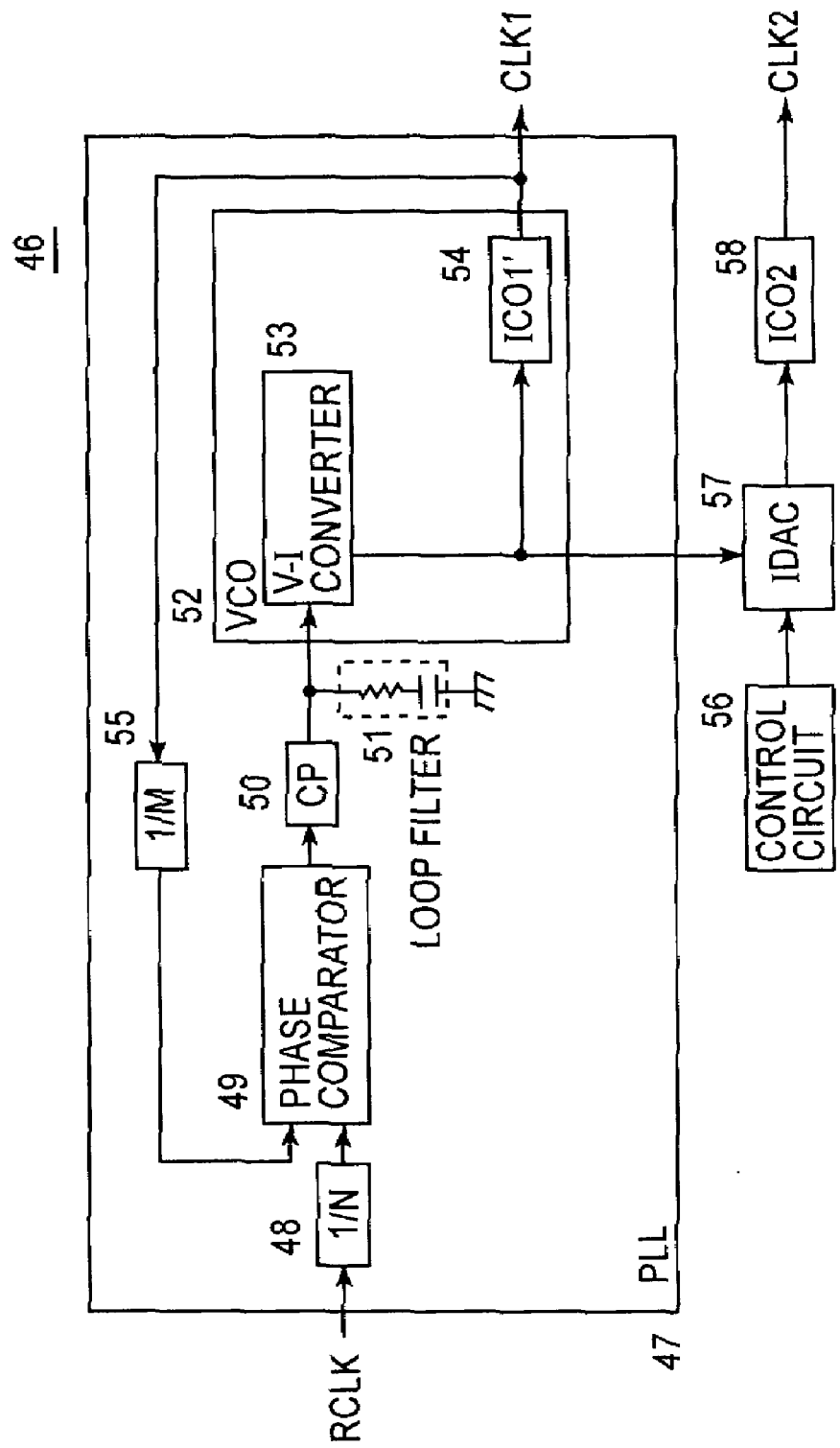
FIG. 20 is an illustration of the second embodiment of the present invention.

FIG. 20 shows embodiment two of the present invention.

FIG. 20 of the present invention is a clock generator circuit, which simultaneously generates clock No. 1 (CLK1) and clock No. 2 (CLK2). By making the frequencies of one side of any clock variable, the electromagnetic radiation from clock generation circuits is reduced.

For example, depending on the electronic devices, some components or parts require precise clocks. In such components, it is not possible to fluctuate even very slightly the frequencies of the clocks.

Embodiment two of the present invention is designed for electronic equipment that houses such components and ensures that the frequencies within many multiple clocks that may be generated are not fluctuated.

The clock generator circuit 46 in embodiment two of the present invention includes the CLK1 clock generator portion which includes PLL 47 that outputs the first operation clock CLK1 and, the CLK2 generator portion that outputs the second operation clock CLK2 after receiving current signals from PLL 47.

The CLK1 clock generator portion includes 1/N frequency divider 48, phase comparator 49, CP (charge pump) 50, loop filter 51, VCO (voltage controlled oscillator) 52 and 1/M frequency divider 55. Apart from the configuration of VCO, PLL 47 is structured generally the same as PLL 18 shown in FIG. 6.

VCO 52 includes V-I converter 53 and ICO1 (current controlled oscillator) 54.

The V-I converter 53 converts the voltage signal that is supplied from the loop filter 51 into the current signal and ICO1 54 outputs first clock CLK1 and the frequency that is corresponding to the current signal.

IDAC 57 includes CLK2 clock generator portion and changes the current signal that is outputted from the VCO 52 and V-I converter 53 on the basis of the control signals from control circuit 56 and outputs the signal. ICO2 58 outputs the CLK2 at a frequency that corresponds to the modified current signal, then the oscillation frequency is changed. However, control circuit 56 is equipped with the same configuration as the control circuits shown in FIGS. 13, 15 and 16, but is not limited to this type of a configuration alone.

As the frequency of CLK1 that is generated in the CLK1 generator portion cannot be made variable, it is also not possible to reduce the electromagnetic radiation. However, the frequency of the second clock CLK2 that is generated in the CLK2 generator portion can be made variable by supplying variable current signal to the IC02 58 from IDAC 57. Consequently, the clock generator circuit in embodiment two of the present invention effectively reduces the electromagnetic radiation.

Figure 21:
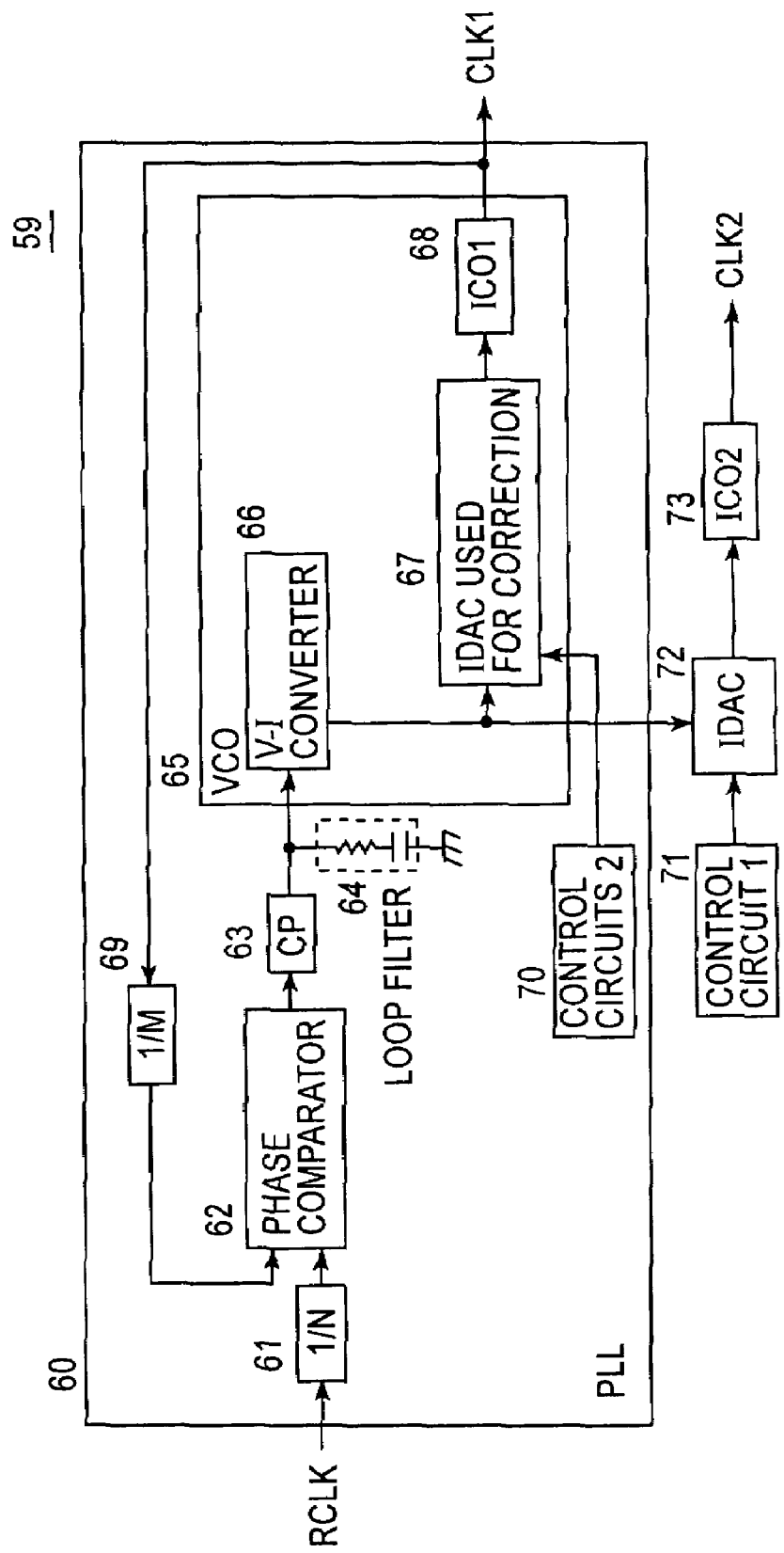
FIG. 21 is an illustration of the third embodiment of the present invention.

FIG. 21 shows embodiment three of the present invention.

Embodiment three of the present invention includes generally the same configuration as has been shown in embodiment two in FIG. 20. The points where embodiment three differs from embodiment two is how the supplementary IDAC 67 within the VCO of the PLL that constitutes the first clock generator portion is set up.

We shall now consider the case when the IDAC 72 did not change the current signals from the V-I converter 66. The ICO1 68 that supplies the same current signals from the V-I converter 66 and the ICO2 73 should actually output the clock with the same frequency. However, due to the dispersion in manufacturing processes, there are cases of differences in the clocks.

Because of that, the IDAC 67 that is used to correct the current signal from the V-I converter 66 is inserted in between V-I converter 66 and the ICO1 68. The corrective IDAC 67 is controlled by ICO2 68. The current signal Ic wherein the error caused by manufacturing inconsistency is corrected is supplied to the ICO1 68. On account of the correction of this error, the PLL 60, includes a first clock generator part, and can also generate the first clock CLK1. This configuration also realizes a high precision clock generator circuit. The configuration of the control circuit (70) which controls the corrective IDAC 67 is also used for the purpose of adjustments and could be for example, terminal clips such as GND clips and current power clips, or composed of registers.

Figure 22:
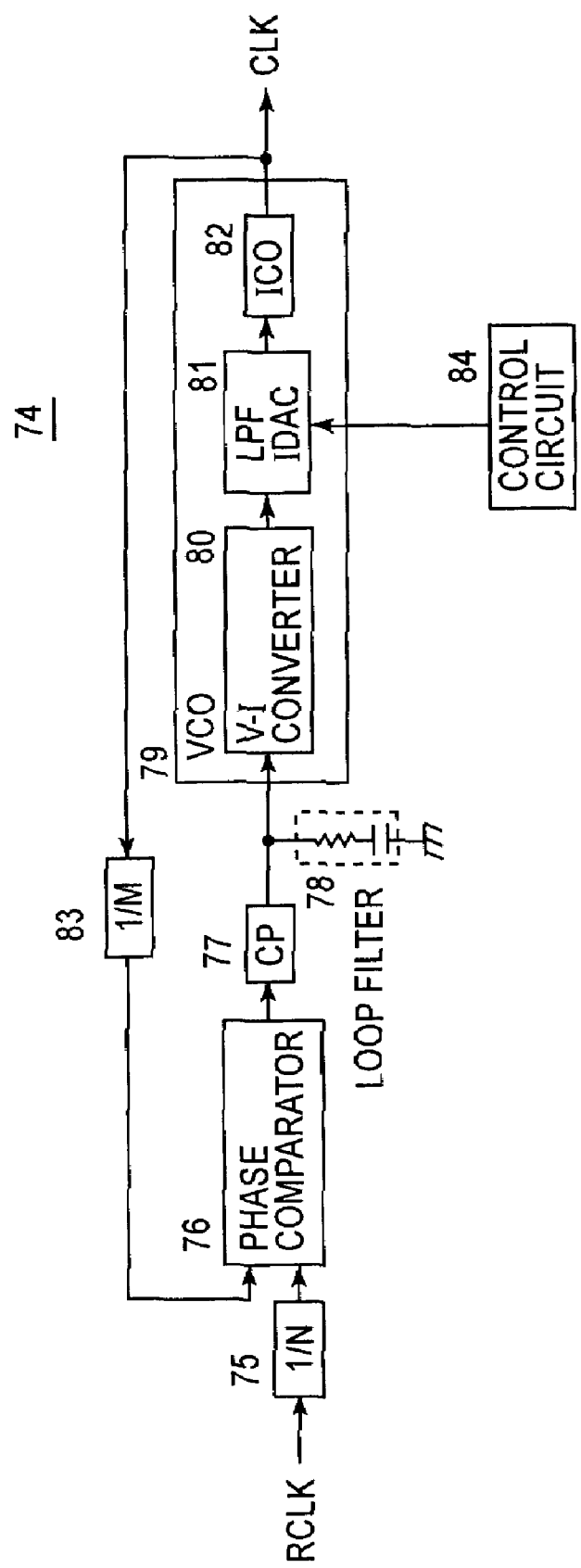
FIG. 22 is an illustration of the fourth embodiment of the present invention.

However, in embodiment three of the present invention, similar to embodiment two of the invention, the frequency of the CLK2 which is generated by the second generator portion can be made variable based on the supply of the variable current signal to the ICO2 73 by IDAC 72. Consequently, the clock generator circuit in embodiment three can most also reduces the radiation of the electromagnetic waves FIG. 22 shows the embodiment 4 of the present invention.

Embodiment four includes generally the same structure as embodiment one, as shown in FIG. 6. The point of difference between embodiment one and embodiment four is the use of IDAC 79 attached to the LPF (low pass filter).

Figure 23:
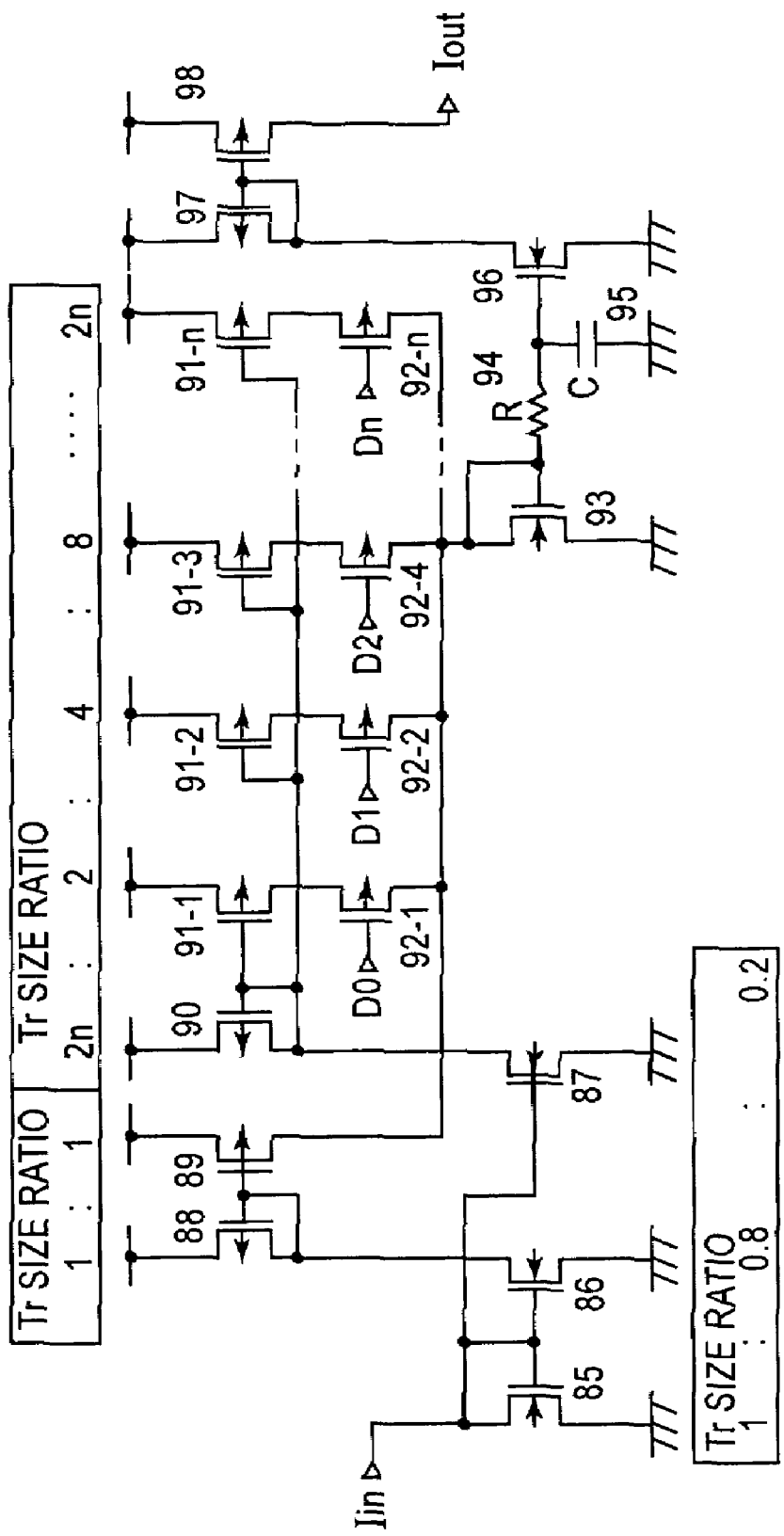
FIG. 23 is an illustration of the present invention showing an Example of the IDAC with an LPF.

FIG. 23 shows an example of the IDAC with the attached LPF. The present invention is not limited by this example. Many other modifications and variations could also be used by one of ordinary skill in the art.

The IDAC as shown in FIG. 23 includes generally the same configuration as the IDAC shown in FIG. 11. However, IDAC includes a LPF which is constituted from PMOS transistor 93 and 96 in the current output part, resistor 94, condenser 95 and NMOS transistors 97 and 98.

In the IDAC, there are cases when a glitch (noise) occurs in the current output at the time of changing the input data. If this glitch is sent to the ICO, the ICO outputs a high frequency signal corresponding to the glitch. As a result, the PLL moves out of the locked state and could possibly come to a stage when it could not be maintained in the standard frequency.

Hence, an IDAC that includes a LPF smoothes out the current output, and the generated glitch, preventing the PLL from moving out of the locked state. Thus, enabling and providing a PLL that has a high level of accuracy.

Based on the above, the present invention achieves the following results.

(1) The oscillation frequency spectrum can be effectively diffused and the electro magnetic radiation can be reduced.

(2) It is possible to freely set the degree of diffusion of the oscillation frequency spectrum.

(3) It is possible to accurately transition the oscillation frequency spectrum.

(4) It is also possible to effectively deal with the dispersion on account of process fluctuation, temperature fluctuation and fluctuations in the power source voltage etc.

As this invention is able to achieve the above, it becomes particularly useful in electronic devices where it is necessary to control the electromagnetic radiation such as in printers. Other aspects and advantages of the present invention would be apparent to one skilled in the art from the above description, taken in conjunction with the accompanying drawings. The foregoing are illustrations of the principles of the present invention, by way of example only.

I claim:

1. A clock generator circuit comprising:
    a phase comparator receiving a standard clock signal and an operating clock signal and generating an output signal; and
    a voltage controlled oscillator generating the operating clock signal based on the output signal of the phase comparator,
    wherein the voltage controlled oscillator comprises:
    a voltage current converter converting a voltage signal into a current signal;
    a current D/A converter fluctuating the current signal based on a digital signal; and
    a current controlled oscillator oscillating the operating clock signal of which frequency corresponds to each of the variable current signals;
    wherein the current DA converter has a plurality of current sources including current mirror circuits.

2. The clock generator circuit of claim 1 further comprising a first frequency dividing circuit frequency-dividing the standard clock signal and a second frequency dividing circuit frequency-dividing the operation clock signal.

3. The clock generator circuit of claim 1, wherein the current D/A converter is a current D/A converter with a low pass filter.

4. The clock generator circuit of claim 1, further comprising a control circuit controlling the current D/A converter.

5. The clock generator circuit of claim 1, further comprising a determining circuit to determine the range of change of frequency of the clock oscillated by the current controlled oscillator.

6. A clock generator circuit for generating an operating clock based on a current signal generated based on a result of a comparison between a standard clock signal and a comparison clock signal comprising:
    a first circuit generating a plurality of current signals; and
    a second circuit generating a plurality of operating clock signals of which frequencies are different with each other based on the plurality of current signals,
    wherein the first circuit comprises a current D/A converter that is controlled by a digital signal;
    wherein the current DA converter has a plurality of current sources including current mirror circuits.

7. The clock generator circuit of claim 6, wherein the current D/A converter includes a low pass filter.

8. The clock generator circuit of claim 6 further comprising a control circuit controlling the first circuit.

9. A clock generator circuit comprising:
    a first clock generator part generating a first clock signal, wherein the first clock generator part comprises a phase comparator for comparing a standard clock signal and an operating clock signal, a voltage current converter converting a signal based on the comparison results into a current signal and a first current controlled oscillator generating the first clock signal based on the current signal; and
    a second clock generator part generating a second clock signal, wherein the second clock generator part comprises a current D/A converter converting the current signal into variable current signals based on a digital signal for spreading spectrum and a second current controlled oscillator oscillating the second clock signal of which frequency corresponds to each of the variable current signals;
    wherein the current DA converter has a plurality of current sources including current mirror circuits.

10. The clock generator circuit of claim 9, wherein the current D/A converter is a current D/A converter with a low pass filter.

11. The clock generator circuit of claim 9, further comprising a control circuit controlling the current D/A converter.

12. The clock generator circuit of claim 9, further comprising a determining circuit to determine the range of change of frequency of the clock oscillated by the second current controlled oscillator.

13. The clock generator circuit of claim 9, wherein the first clock generator part includes a corrective circuit that corrects the current signal and supplies the corrected current signal to the first voltage controlled oscillator.

14. A clock generator circuit comprising:
    a first circuit generating a first clock signal of a frequency spectrum containing N number of peaks (N is an integer); and
    a second circuit generating a second clock signal of a frequency containing a frequency spectrum with M number of peaks (M is an integer that is greater than 1, M>N) on the basis of a current signal generated based on a digital signal for spreading spectrum, the digital signal for spreading spectrum is based on a comparison result of comparing a standard clock signal and an operating clock signal;
    wherein the current DA converter has a plurality of current sources including current mirror circuits.

15. The clock generator circuit of claim 14, wherein the circuit includes a current D/A converter or a current D/A converter with a low pass filter to fluctuate the current signal.

16. A PLL circuit comprising:
    a phase comparator receiving and comparing a standard clock signal and an operating clock signal;
    a charge pump supplying an output signal based on the comparison;
    a voltage controlled oscillator outputting the operating clock signal based on the output signal of the charge pump;
    wherein the voltage controlled oscillator comprises a voltage current converter that converts a voltage signal into a current signal;

a current D/A converter that changes the current signal into a variable current signal based on a digital signal; and a current controlled oscillator that oscillates the operating clock signal based on the variable current signal;

wherein the current DA converter has a plurality of current sources including current mirror circuits.

17. A clock generation method comprising the steps of:

comparing a standard clock signal and an operating clock signal;

converting the results of the comparison into a current signal;

using a current D/A converter to change the current signal into variable current signals based on a digital control signal; and outputting the operating clock signal with varying frequencies based on the variable current signal;

wherein the current DA converter has a plurality of current sources including current mirror circuits.

18. The clock generator circuit of claim 1, wherein at least one of the plurality of current circuits is selected based on the digital signal.

* * * * *